United States Patent
Cho et al.

(10) Patent No.: US 9,034,143 B2
(45) Date of Patent: May 19, 2015

(54) INDUCTIVE/CAPACITIVE HYBRID PLASMA SOURCE AND SYSTEM WITH SUCH CHAMBER

(71) Applicant: INTEVAC, INC., Santa Clara, CA (US)

(72) Inventors: Young Kyu Cho, San Jose, CA (US);
Kenneth Tan, San Jose, CA (US);
Karthik Janakiraman, San Jose, CA (US); Judy Huang, Los Gatos, CA (US)

(73) Assignee: INTEVAC, INC., Santa Clara, CA (US)

( * ) Notice: Subject to any disclaimer, the term of this patent is extended or adjusted under 35 U.S.C. 154(b) by 0 days.

(21) Appl. No.: 13/644,620

(22) Filed: Oct. 4, 2012

(65) Prior Publication Data
US 2013/0087531 A1 Apr. 11, 2013

Related U.S. Application Data

(60) Provisional application No. 61/543,749, filed on Oct. 5, 2011.

(51) Int. Cl.
*C23C 16/00* (2006.01)
*C23F 1/00* (2006.01)
*H01J 7/24* (2006.01)
(Continued)

(52) U.S. Cl.
CPC ......... *H01J 37/32091* (2013.01); *H01J 37/321* (2013.01)

(58) Field of Classification Search
USPC ................ 156/345.43–345.49; 118/715, 722, 118/723 R, 723 E, 723 I; 315/111.21, 111.41, 315/111.51
See application file for complete search history.

(56) References Cited

U.S. PATENT DOCUMENTS

| | | |
|---|---|---|
| 5,599,396 A | 2/1997 | Sandhu |
| 5,619,103 A | 4/1997 | Tobin et al. |

(Continued)

FOREIGN PATENT DOCUMENTS

| | | |
|---|---|---|
| CN | 102789950 A | 11/2012 |
| EP | 2408275 A1 | 1/2012 |

(Continued)

OTHER PUBLICATIONS

International Search Report and Written Opinion for PCT/US2012/058819 dated Dec. 27, 2012.

(Continued)

*Primary Examiner* — Maureen Gramaglia
(74) *Attorney, Agent, or Firm* — Nixon Peabody LLP; Joseph Bach, Esq.

(57) ABSTRACT

A plasma processing chamber having capacitive and inductive coupling of RF power. An RF power source is connected to an inductive coil and to a top electrode via a variable capacitor to control the ratio of power applied to the coil and electrode. The bottom electrode, which is part of the chuck holding the substrates, is floating, but has parasitive capacitance coupling to ground. No RF bias is applied to the chuck and/or the substrate, but the substrate is chucked using DC power. In a system utilizing the chamber, the chuck is movable and is loaded with substrates outside the chamber, enter the chamber from one side for processing, exit the chamber from an opposite side after the processing, and is unloaded in an unloading chamber. The chuck is then transported back to the loading chamber. Substrates are delivered to and removed from the system using conveyor belts.

12 Claims, 2 Drawing Sheets

(51) Int. Cl.
*H05B 31/26* (2006.01)
*H01J 37/32* (2006.01)

(56) References Cited

U.S. PATENT DOCUMENTS

| | | | |
|---|---|---|---|
| 5,795,429 | A | 8/1998 | Ishii et al. |
| 6,020,686 | A | 2/2000 | Ye et al. |
| 6,080,271 | A | 6/2000 | Fujii |
| 6,184,158 | B1 | 2/2001 | Shufflecotham et al. |
| 6,259,209 | B1 * | 7/2001 | Bhardwaj et al. ........ 156/345.12 |
| 6,417,626 | B1 | 7/2002 | Brcka et al. |
| 6,447,636 | B1 | 9/2002 | Qian et al. |
| 6,469,448 | B2 | 10/2002 | Taguchi et al. |
| 6,623,596 | B1 | 9/2003 | Collins et al. |
| 7,780,864 | B2 | 8/2010 | Paterson et al. |
| 2003/0035705 | A1 | 2/2003 | Johnson |
| 2003/0085114 | A1 | 5/2003 | Johnson et al. |
| 2004/0126493 | A1 * | 7/2004 | Shimizu et al. .......... 427/255.28 |
| 2005/0067157 | A1 | 3/2005 | Faybishenko et al. |
| 2007/0209759 | A1 | 9/2007 | Miya et al. |
| 2007/0247074 | A1 | 10/2007 | Paterson et al. |
| 2008/0011424 | A1 | 1/2008 | Yin et al. |
| 2008/0080963 | A1 | 4/2008 | Bufano et al. |
| 2008/0122367 | A1 | 5/2008 | Vinogradov et al. |
| 2008/0251207 | A1 | 10/2008 | Chen et al. |
| 2009/0121638 | A1 | 5/2009 | Price et al. |
| 2009/0145881 | A1 | 6/2009 | Barnes et al. |
| 2010/0003827 | A1 | 1/2010 | Kessels et al. |
| 2010/0154994 | A1 | 6/2010 | Fischer et al. |
| 2010/0327155 | A1 | 12/2010 | Lopez-Avila et al. |
| 2011/0030900 | A1 | 2/2011 | Chen et al. |
| 2011/0045617 | A1 * | 2/2011 | Kang et al. ...................... 438/22 |
| 2012/0291955 | A1 | 11/2012 | Cho et al. |

FOREIGN PATENT DOCUMENTS

| | | |
|---|---|---|
| EP | 2525388 A2 | 11/2012 |
| JP | 2012-243771 A | 12/2012 |
| SG | 185906 A1 | 12/2012 |
| TW | 201301335 A1 | 1/2013 |
| TW | 201316375 A1 | 4/2013 |
| WO | 2008/024392 A2 | 2/2008 |
| WO | 2010/104120 A1 | 9/2010 |
| WO | 2013/052713 A1 | 4/2013 |

OTHER PUBLICATIONS

Extended Search Report for European Patent Application No. 12168204.1 dated May 31, 2013.
Office Action for U.S. Appl. No. 13/473,541 dated Aug. 1, 2013.
Office Action for U.S. Appl. No. 13/473,541 dated Jan. 24, 2014.

* cited by examiner

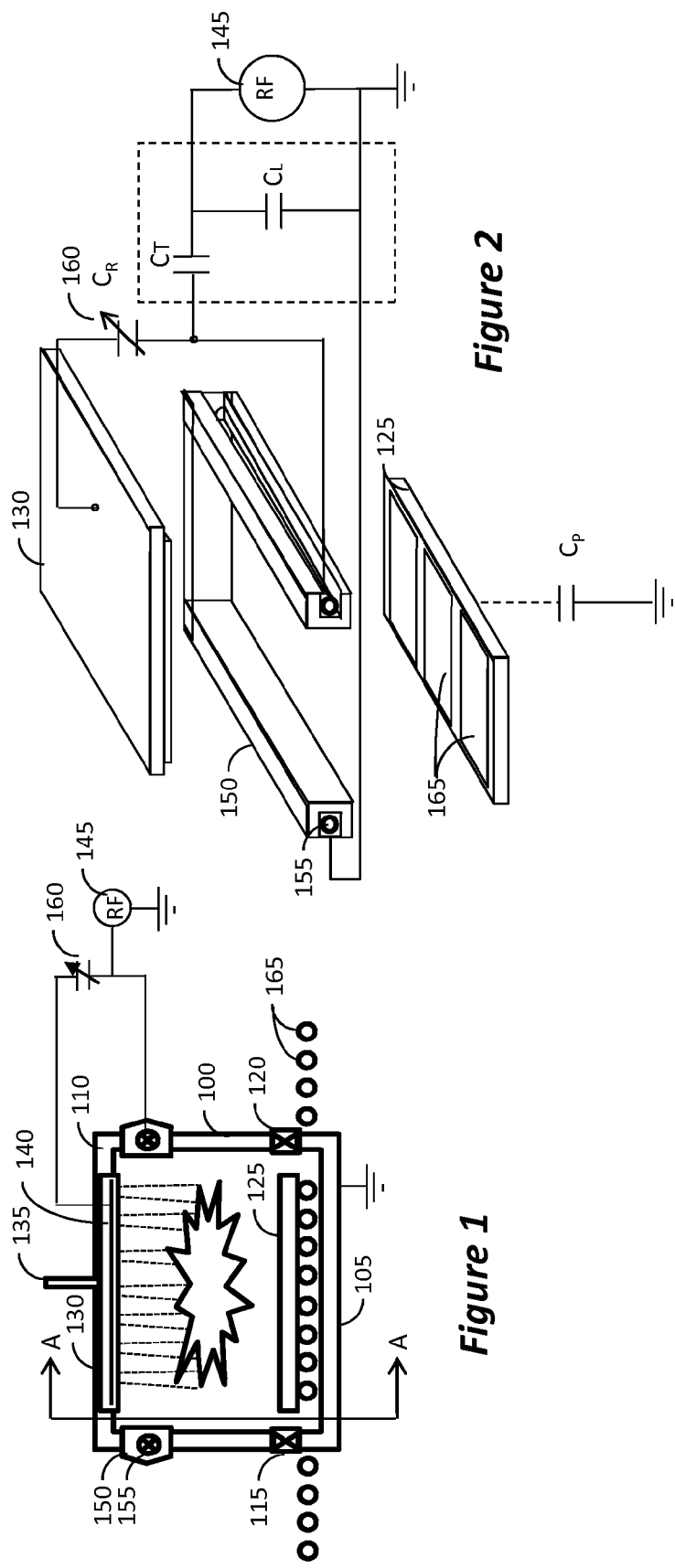

INDUCTIVE/CAPACITIVE HYBRID PLASMA SOURCE AND SYSTEM WITH SUCH CHAMBER

RELATED APPLICATION

This application claims priority benefit from U.S. Provisional Application Ser. No. 61/543,749, filed on Oct. 5, 2011, the content of which is incorporated herein by reference in its entirety.

BACKGROUND

1. Field

This disclosure relates to plasma processing chambers and, in particular, to plasma processing chambers utilizing inductive and capacitive coupling of RF power to ignite and sustain plasma.

2. Related Art

Plasma chambers that sustain plasma by coupling RF power into a vacuum chamber are well known. Prior art chambers use capacitive coupling, wherein the RF power is applied to two electrodes that form a capacitor. Other prior art chambers utilize inductive coupling, wherein the RF power is applied to a coil or an antenna, which radiates the RF power into the plasma chamber via a dielectric window. Yet other chambers utilize a combination or a hybrid of capacitive and inductive coupling. Examples of such hybrid chambers can be found in, for example, U.S. Pat. Nos. 6,020,686; 6,417,626; 7,780,864; 5,599,396; 6,447,636; and 5,599,396, listed here in no particular order.

One common feature of these hybrid chambers is that the RF power is applied to the inductive antenna and to the lower electrode, such that the bottom electrode serves as the cathode and the top electrode serves as an anode. Such an arrangement requires complex RF wiring to the chuck. Additionally, when the RF coil is provided on top of the chamber, a relatively thick dielectric window is required, in order to overcome the stresses caused by the vacuum inside the chamber.

As can be understood, the prior art relates to fabrication of semiconductor chips. However, recently there has been an increased interest in utilizing plasma processing, such as, e.g., plasma etch, for fabrication of solar cells. The plasma chambers of the prior art fail to satisfy the requirements of plasma processing for solar cells, especially with regards to throughput. A commercially viable plasma chamber for processing solar cells should have at least an order of magnitude higher throughput from standard semiconductor chambers. Accordingly, a new plasma chamber design is needed that fulfills these requirements.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

A hybrid inductive/capacitive plasma chamber is disclosed, which is especially suitable for fabrication of substrates at high throughput. The disclosed chamber may be used for fabricating large substrates or several smaller substrates simultaneously. For example, disclosed embodiments can be used for fabrication of large flat panel displays, or multiple solar cells simultaneously, providing high throughput.

Various embodiments provide a chamber that has a ceiling which forms a combined showerhead and a cathode. An RF coil is provided about the sidewall of the chamber, behind a dielectric window. A single RF power source is used to power both the cathode and the coil. A variable capacitor is used to change the ratio of power applied to the cathode and the coil.

In illustrated embodiments, the substrate(s) is (are) held in place on a chuck, which also serves as an anode. The anode can be grounded or floating. In one embodiment, the anode is floating, but has parasitic capacitance to ground, such that it is parasitively grounded. No RF bias is applied to the chuck and/or the substrate. The substrate can be chucked using DC power. In one embodiment, the chuck supports a plurality of substrates simultaneously.

Since the RF power is applied to the top cathode, no complex RF wiring to the chuck is required. Consequently, the chuck can be made movable, rather than the conventional stationary chuck. Having the chuck movable enables high throughput of the system, since no robot arm is needed to load substrates from a transfer chamber to the processing chamber, as is done in the prior art.

A system architecture is provided for processing substrates, such as solar cells, at high throughputs. The system can be used, e.g., for etching substrates in the process of fabricating solar cells. The substrates enter the system on a conveyor belt. Once arriving at a high vacuum loadlock, the substrates are transferred onto a movable chuck. The movable chuck then travels into the processing chamber and stops inside the chamber. Plasma is ignited inside the chamber to process the substrates, while the chuck is stationary. Once plasma processing is completed, the chuck travels to a subsequent processing chamber, or to an unloading station. Once the chuck arrives at the unloading station, the substrates are transferred onto another conveyor belt, and the chuck is returned to the loading station.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a schematic illustrating the major parts of a plasma processing chamber according to one embodiment.

FIG. 2 illustrates a partial cross-section along line A-A of FIG. 1.

DETAILED DESCRIPTION

Figure 3:
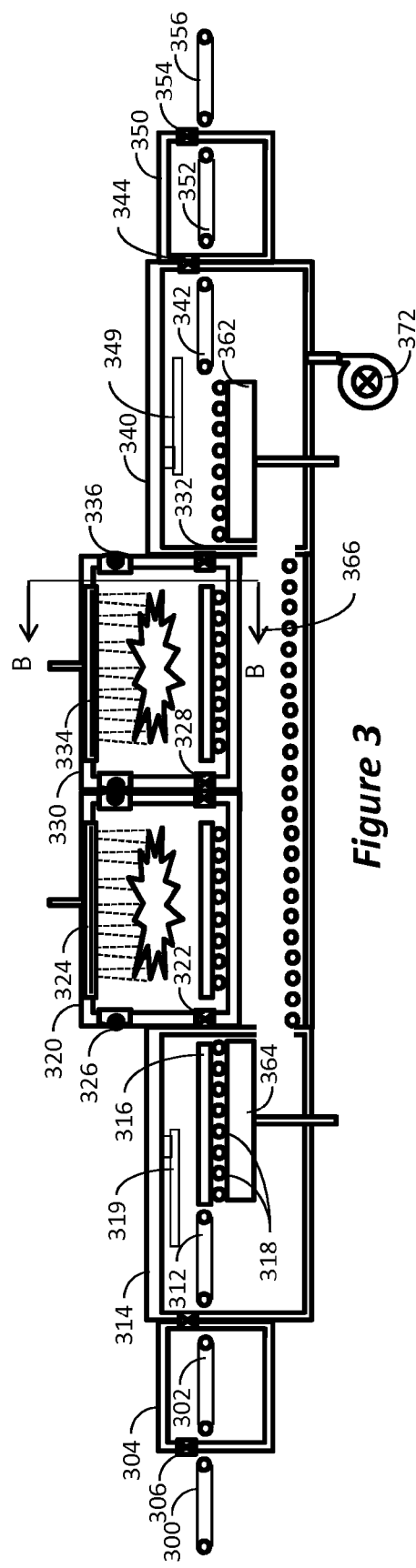
FIG. 3 illustrates an example of a system utilizing plasma chamber for processing substrates, according to an embodiment of the invention.

Various features of the plasma chamber and the processing system will now be described with reference to the drawings, which depict various embodiments. The description will include examples of plasma processing chambers, processing systems incorporating one or more of the plasma processing chamber, and methods for processing substrates for fabrication of, e.g., solar cells.

FIG. 1 is a schematic illustrating the major parts of a plasma processing chamber according to one embodiment. The chamber consists of a vacuum enclosure having sidewall 100, floor 105 and ceiling 110. The floor is grounded, while the sidewall 100 may or may not be grounded. The side wall includes an entry valve 115 and exit valve 120, through which the chuck 125 enters and leaves the enclosure. The chuck 125 may travel on motorized wheels 165, or any other transport mechanism. The chuck 140 may hold one large substrate or several smaller substrates. A showerhead 130 serves as at least part of the ceiling. The showerhead receives processing gas via gas supply 135, and distributes the gas into the enclosure, as exemplified by the dotted lines.

The showerhead also includes an electrode 140, which is coupled to the "hot" side of the RF power source 145, thereby serving as a cathode. The chuck 125, on the other hand, is left electrically floating, by having no direct electrical connection to the RF power source or any other potential. However, since the chuck 125 is in close proximity and in parallel orientation to the grounded floor 105, it is coupled to the grounded floor by parasitic capacitance and is thereby said to be parasitically coupled to ground. By the arrangement of the cathode 140 connection to the RF power source 145 and the chuck's 125 parasitic coupling to ground, the RF power is capacitively coupled to the plasma within the chamber.

The power from RF power supplier 145 is also coupled to the plasma inductively. A coil 155 is provided about an upper part of the sidewall 100, wherein a dielectric window 150 is provided. The coil 155 resides in the atmospheric side of the sidewall 100. The coil is connected to the RF power supplier 145. As can be understood, a single RF power supplier 145 is used to energize both cathode 140 and coil 155. The ratio of power applied to the cathode 140 and coil 155 is control via variable capacitor 160.

The arrangement illustrates in FIG. 1 provides certain advantages over prior art plasma chambers. For example, instead of having separate power suppliers for the capacitive and inductive coupling, a single power supplier is used. The ratio of power supplied to the capacitive coupling and inductive coupling is controlled simply by a variable capacitor. The coil arrangement requires only a narrow dielectric window, such that it does not need to be thick to withstand stresses caused by pressure differential. Since the capacitive coupling is applied to the top electrode, no complex wiring is required to deliver power to the chuck. Consequently, the chuck can be movable, and need not be stationary. By grounding the floor of the chamber and having the chuck in close proximity and parallel orientation to the floor, the chuck has parasitic coupling to ground potential, thereby serving as an anode for the capacitive coupling of the RF power to the plasma.

FIG. 2 illustrates a partial cross-section along line A-A of FIG. 1. Since FIG. 2 is provided in order to provide an example of the combined capacitive and inductive RF coupling, only the elements relating to that function are illustrated. FIG. 2 shows the showerhead 130, which incorporates a top electrode 140. The hot terminal of the RF power supplier 145 is coupled to the top electrode 140, thereby making it the cathode. The hot side of the RF power supplier 145 is also coupled to one end of the coil 155, and the other end of the coil 155 is connected to ground potential. The chuck 125 is shown to be coupled to ground via parasitic capacitance Cp, as illustrated using the broken line.

In the particular example of FIG. 2, the chuck is shown supporting three substrates 165 simultaneously. The chuck may be an electrostatic chuck, in which case it is coupled to a DC potential via contacts (not shown) in the back of the chuck. The inductive coupling is made by a copper tube wound into a coil, e.g., a single turn coil, which is situated inside a ceramic housing. Here the ceramic housing has a U-shaped cross-section. The showerhead may be made of, e.g., anodized aluminum and may be liquid cooled.

FIG. 2 also shows two capacitors $C_T$ and $C_L$, which form an impedance match circuit (shown by the broken-line rectangle), to ensure maximum power delivery from the RF power supplier 145 to the plasma. The impedance match circuit is coupled between the RF power supplier and the variable capacitor 160. Other impedance matching circuits which utilize a combination of capacitors, inductors and/or resistors may also be used. Also, in order to control the power distribution from the RF power supplier 145, a variable capacitor $C_R$ is installed on the line leading to the top electrode 140. By adjusting the setting of the variable capacitor, the ratio of the power directed to the top electrode 140 and the coil 155 can be varied. Of course, the variable capacitor may be installed on the line leading to the inductive coil 155 instead.

An example of a system utilizing embodiments of the chamber described above is shown in FIG. 3. The system illustrated in FIG. 3 utilizes only two plasma chambers, but more can be added, such that the system can be modular and can include one or more plasma processing chambers. This system can be used to process substrates at a high throughput. In one example, the system is used to etch the sun-facing surface of solar cells, so as to increase the absorption of the sun energy by the solar cell. This is generally referred to as solar cell texture etch.

In FIG. 3, substrates, such as wafers for fabrication of solar cells, arrive on an incoming conveyor belt 300. The conveyor belt 300 can support one or more substrates laterally, such that several substrates can be loaded into the system simultaneously. For example, the substrates can be traveling on the conveyor 300 in three-columns wide and endless rows. The wafers are then delivered via valve gate 306 onto conveyor 302, which resides in intermediate loadlock 304. For example, in the case where the wafers are three-column wide, the wafers can be delivered three at a time (single row), six at a time (double row), or continuously (endless rows). Loadlock 304 has an intermediate reduced pressure, which is lower than atmospheric pressure, but higher than the vacuum state of the plasma processing chambers.

From the intermediate loadlock 304 the wafers are transferred onto conveyor 312 inside loading station 314. At this juncture it should be noted that more than one single intermediate loadlock 304 can be used, such that several intermediate loadlocks are staggered together to introduce the wafers to increased vacuum atmosphere at each successive intermediate loadlock, until they reach the loading station 314. In transfer chamber 314 the wafers are transferred from the conveyor 312 onto chuck 316, using a transfer mechanism 319, such as vacuum lifter. Chuck 316 can support several substrates simultaneously, e.g., three substrates in three columns and single row, six substrates at three columns and double rows, etc. Chuck 316 is movable and rides on, e.g., motorized wheels 318, freely-rotating wheels with linear motor, etc.

From the loading station 314, the chuck is transported into plasma processing chamber 320, via entry gate valve 322. The chuck then stops inside the chamber 320, and plasma is ignited and sustain inside chamber 320 by applying RF power to the top electrode 324 and coil 326, as described above. Thus, the plurality of wafers positioned on the chuck 316 are processed simultaneously. For example, when the system is used for texture etch of solar cells, reactive gas, such as SF6, is injected into the chamber via the showerhead 324, and is ionized by the RF power, so as to etch the silicon surface of the substrates.

When processing inside chamber 320 is completed, the chuck is transported out of chamber 320 via exit gate valve 328. If another plasma chamber is used, as is illustrated in this example, exit gate valve 328 also serves as entry gate valve for the next chamber 330. Once inside chamber 330, the chuck stops again, and plasma is ignited and sustained by applying RF power to the top electrode 334 and coil 336, as described above. If another chamber is used, the process is repeated as many times as the number of chambers are used. Otherwise, the chuck leaves chamber 330 (or the last plasma chamber, as the case may be) via exit gate valve 332 and into unload station 340.

In unload station 340 the wafers are unloaded from the chuck 316 and onto conveyor 342, using a transfer mechanism 349, such as vacuum lifter. Conveyor 342 transport the wafers via gate 344 to conveyor 352, residing in intermediate exit loadlock 350. Loadlock 350 is maintained at reduced vacuum as compared to unload station 340. While only one exit loadlock is shown in FIG. 3, several exit loadlocks can be used to gradually introduce the wafers to increased pressure towards atmospheric pressure. The wafers are then delivered via exit gate 354 to conveyor 356 at atmospheric environment.

Meanwhile, after the wafers are unloaded from chuck 316 in unload chamber 340, the chuck is lowered by elevator 362 and is transported back via a return section 366 to elevator 364 in loading chamber 314. As can be understood, the system has several chucks, such that while one or more chucks are being loaded, unloaded and/or transported, other chucks are inside the processing chambers for processing wafers. Also, the loading chamber 314, the unloading chamber 340 and the return section 366 may be maintained under vacuum, as exemplified by vacuum pump 372. Of course, more than one vacuum pump may be used for this purpose, for example, each section may be coupled to an independent vacuum pump.

Figure 4:
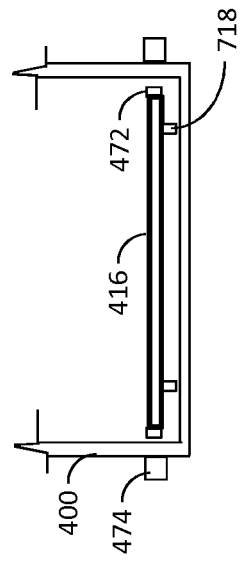
FIG. 4 illustrates an embodiment of chuck transport mechanism.

FIG. 4 illustrates an example of a system for chuck transport. The illustration is taken from a view looking head-on, such that the chuck moves in the direction into or out of the page, as illustrated by cross-section line B-B in FIG. 3. The sidewall of the chamber 400, is shown truncated. The chuck transport arrangement may be the same regardless if it is a plasma processing chamber, a loading chamber, an unloading chamber, or chuck return chamber. The chuck 416 rides on wheels, tracks, or a combination of wheel and tracks, collectively noted as element 718, which confine the chuck's movement in a straight linear direction. Motive forces are applied to the chuck using linear motor, which is composed of permanent magnets 472 attached at both ends of chuck 416 and driving coils 474 situated in atmosphere on the other side of chamber sidewall 400.

To summarize, various embodiment disclosed herein provide a plasma processing apparatus, comprising: a chamber enclosure maintaining vacuum therein, the chamber enclosure having a floor that is coupled to electric ground potential; a dielectric window provided in sidewall of the chamber enclosure; a coil situated outside the chamber enclosure and about the dielectric window; a chuck for supporting substrates and comprising an anode, the anode being electrically floating; a showerhead forming a ceiling of the chamber enclosure, the showerhead delivering gas into the chamber enclosure and comprising a cathode; and an RF power supplier having first terminal coupled to electrical ground potential and second terminal coupled to the coil and the cathode. A variable capacitor is coupled between the second terminal and the coil or the cathode, thereby varying the ratio of power delivered to the coil and the cathode from the RF power supplier. The chuck is configured to be coupled to electrical ground potential via parasitic capacitance.

The system disclosed also comprises a transport mechanism positioned on the floor for transporting the chuck into and out of the enclosure. An entry valve gate is provided on the sidewall to transport the chuck into the enclosure and an exit valve gate positioned linearly opposite the entry valve gate to transport the chuck out of the enclosure. A plurality of linear motor coils are provided outside but next to the chamber enclosure and a plurality of permanent magnets are provided on the chuck to cooperate with the plurality of linear motor coils to transport the chuck. The chuck can be configured for supporting a plurality of substrates simultaneously. Also, an impedance matching network can be coupled between the RF power supplier and the variable capacitor.

For loading substrates into the system, a loading chamber is coupled to the side wall, the loading chamber having an opening cooperating with the entry valve gate, and an unloading chamber is coupled to the side wall and having a second opening cooperating with the exit valve gate. A loading transfer mechanism is positioned inside the loading chamber to load substrates onto the chuck and an unloading transfer mechanism is positioned inside the unloading chamber to unload substrates from the chuck. A loading conveyor belt is positioned inside the loading chamber and delivering substrates to the loading mechanism and an unloading conveyor belt is positioned inside the unloading chamber and removing substrates from the unloading mechanism. A loading elevator is positioned inside the loading chamber for elevating the chuck to receive substrates from the loading conveyor and an unloading elevator is positioned inside the unloading chamber for lowering the chuck after unloading of the substrates.

A return section is provided for returning the chuck from the unloading chamber to the loading chamber. The loading chamber, the unloading chamber and the return section are coupled to a vacuum pump.

A method for processing substrates is also disclosed, the method comprising: loading substrates onto the chuck; injecting process gas through the showerhead; igniting plasma by coupling the RF power supplier to the cathode and to the inductive coil via a variable capacitor; varying the position of the variable capacitor to control the ratio of power coupled from the RF power supplier to the cathode and to the inductive coil. The method further comprises capacitively coupling the anode to electrical ground potential. Loading substrates onto the chuck may be performed by transporting the chuck into a loading chamber; loading substrates onto the chuck; and, transporting the chuck with the substrates into the vacuum enclosure. After plasma processing of the substrate is completed, the method proceeds to transport the chuck out of the vacuum enclosure and into an unloading chamber and remove the substrates from the chuck. After removing the substrates from the chuck, the method proceeds by transporting the chuck back to the loading chamber. Also, after plasma processing of the substrate in the vacuum enclosure is completed, the method may proceed by transporting the chuck out of the vacuum enclosure and into a subsequent vacuum enclosure for further plasma processing.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A plasma processing apparatus, comprising:
   a chamber enclosure maintaining vacuum therein, the chamber enclosure having a floor that is coupled to electric ground potential;
   a dielectric window provided in sidewall of the chamber enclosure, wherein the dielectric window comprises a ceramic housing having a U-shaped cross-section;
   a coil situated outside the chamber enclosure and about the dielectric window, wherein the coil is situated inside the U-shaped cross-section;
   a transportable electrostatic chuck for supporting substrates and having contacts coupled to DC potential for chucking the substrates, the chuck comprising an anode, the anode being electrically floating but positioned in close proximity and in parallel orientation to the floor, to thereby be coupled to the electrical ground potential via parasitic capacitance;
   a showerhead forming a ceiling of the chamber enclosure, the showerhead delivering gas into the chamber enclosure and comprising a cathode;
   an RF power supplier having first terminal coupled to electrical ground potential and second terminal coupled to the coil and the cathode;
   a transport mechanism positioned on the floor for transporting the chuck into and out of the enclosure; and,
   wherein the sidewall comprises an entry valve gate to transport the chuck into the enclosure and an exit valve gate positioned linearly opposite the entry valve gate to transport the chuck out of the enclosure.

2. The plasma processing apparatus of claim 1, further comprising a variable capacitor coupled between the second terminal and the coil or the cathode, thereby varying ratio of power delivered to the coil and the cathode from the RF power supplier.

3. The plasma processing apparatus of claim 1, further comprising a plurality of linear motor coils provided outside but next to the chamber enclosure and wherein the chuck comprises a plurality of permanent magnets cooperating with the plurality of linear motor coils to transport the chuck.

4. The plasma processing apparatus of claim 1, wherein the chuck is configured for supporting a plurality of substrates simultaneously.

5. The plasma processing apparatus of claim 1, further comprising an impedance matching network coupled between the RF power supplier and the variable capacitor.

6. The plasma processing apparatus of claim 1, further comprising:
   a loading chamber coupled to the side wall and having an opening cooperating with the entry valve gate, and an unloading chamber coupled to the side wall and having a second opening cooperating with the exit valve gate;
   a loading transfer mechanism positioned inside the loading chamber to load substrates onto the chuck; and,
   an unloading transfer mechanism positioned inside the unloading chamber to unload substrates from the chuck.

7. The plasma processing apparatus of claim 6, further comprising:
   a loading conveyor belt positioned inside the loading chamber and delivering substrates to the loading mechanism; and,
   an unloading conveyor belt positioned inside the unloading chamber and removing substrates from the unloading mechanism.

8. The plasma processing apparatus of claim 7, further comprising a loading elevator positioned inside the loading chamber for elevating the chuck to receive substrates from the loading conveyor; and an unloading elevator positioned inside the unloading chamber for lowering the chuck after unloading of the substrates.

9. The plasma processing apparatus of claim 8, further comprising a return section for returning the chuck from the unloading chamber to the loading chamber.

10. The plasma processing apparatus of claim 8, wherein the loading chamber, the unloading chamber and the return section are coupled to a vacuum pump.

11. The plasma processing apparatus of claim 6, further comprising at least one additional chamber enclosure positioned between the chamber enclosure and the unloading chamber and configured for sustaining plasma therein.

12. The plasma processing apparatus of claim 1, wherein the coil comprises a single turn coil.

* * * * *